United States Patent [19]

Duncan

[11] Patent Number: 4,802,325

[45] Date of Patent: Feb. 7, 1989

[54] METHOD OF PACKAGING

[75] Inventor: William Duncan, Glasgow, United Kingdom

[73] Assignee: Motorola Inc., Schaumburg, Ill.

[21] Appl. No.: 75,787

[22] Filed: Jul. 20, 1987

[51] Int. Cl.[4] .................... B65B 35/50; B65B 25/00
[52] U.S. Cl. ........................... 53/444; 53/446; 53/447; 53/449; 53/461; 53/475
[58] Field of Search ............... 53/397, 449, 444, 446, 53/447, 461, 472, 475

[56] References Cited

U.S. PATENT DOCUMENTS

| | | | |
|---|---|---|---|
| 410,553 | 9/1889 | Lang | 53/444 X |
| 1,590,995 | 6/1926 | Nelson | 53/442 |
| 2,261,423 | 11/1941 | Toulouse | 53/475 |
| 3,925,959 | 12/1975 | Dykes et al. | 53/446 X |
| 4,250,687 | 2/1981 | Lueneberg et al. | 53/444 X |
| 4,453,368 | 6/1984 | Egee | 53/444 X |
| 4,535,587 | 8/1985 | Rias | 53/447 X |
| 4,693,056 | 9/1987 | Raszewski | 53/472 X |
| 4,706,438 | 11/1987 | Ohlbach | 53/472 X |

FOREIGN PATENT DOCUMENTS

| | | | |
|---|---|---|---|
| 567554 | 11/1958 | Belgium | 53/472 |
| 85/04150 | 9/1985 | PCT Int'l Appl. | 53/472 |

*Primary Examiner*—Horace M. Culver
*Attorney, Agent, or Firm*—Joe E. Barbee

[57] ABSTRACT

A method of packaging components (4) for shipping comprising: loading the components in rails (2); assembling a plurality of the rails into a composite structure (20); and wrapping the composite structure in an anti-static envelope (40) so as to form a quasi-rigid anti-static package (46). The method may further comprise the step of securing the composite structure, e.g. by fixing a strap (18) at each end, immediately before the wrapping step.

A material for use in packaging components for shipping comprising a sandwich material (40) having: a first layer (42) of conductive material and a second layer (44) of static-dissipative material, the first and second layers being bonded together. The outer layer may be made of conductive paper to provide adequate snag- and tear-resistance and the inner layer may be made of an anti-static plastics material.

20 Claims, 3 Drawing Sheets

METHOD OF PACKAGING

INTRODUCTION

This invention relates to packaging, and particularly, though not exclusively, to the packaging of components such as semiconductor devices.

Conventionally, components such as semiconductor integrated circuit devices are loaded, after final testing at the fabrication site, in 'rails' (i.e. hollow longitudinal extrusions shaped to accept a line of semiconductor integrated circuit devices). A desired number of rails (normally each carrying a predetermined convenient number of devices) are then placed in a box, and the box is sealed and shipped to a customer or to a warehouse. In order to prevent static electric damage to the components during shipping, the rails must be made of (or more usually coated with) an anti-static material, and the box must be made of or coated with a similar material.

The box must be strong enough to prevent any expected damage to the rails during shipping, but light enough to minimize the shipping costs. For these reasons the box is conventionally made of corrugated cardboard which is internally coated with carbon-black.

Normally, the rails are placed loosely in the box and damage to the protective carbon-black coating frequently occurs either during insertion of the rails into the box or during shipping. This problem arises inevitably from the fact that the boxes are commonly used in one or a small number of discrete sizes: clearly the box must be large enough for the largest expected number of rails, but any empty space inside the box will increase the risk of damaging the anti-static coating during shipping and will moreover increase the shipping volume and therefore the shipping cost.

Also, a warehouse keeping a stock of semiconductor components frequently opens a received box of railed components in order to supply a small order, and may subsequently open and add to another received box in order to make up an order of an inconvenient number of components. Even with the conventional methods of packaging described above, the possibilities of physical and/or static damage to the components during shipping and possible warehouse handling (although small) are still sufficiently large so as to require original equipment manufacturers (OEM's) or other end users to test the devices before use.

Clearly all of these problems serve to increase the final cost of the components to customers and it will be appreciated that in an industry such as the semiconductor industry which operates on low component cost and high component volume, any increase (however small) in component cost becomes significant.

It is an object of the present invention to provide a method of packaging, a material for use in packaging and a packaged article, wherein the above problems may be overcome or at least alleviated.

SUMMARY OF INVENTION

According to a first aspect of the invention, a method of packaging components for shipping comprises:
  loading the components in rails;
  assembling a plurality of the rails into a composite structure; and
  wrapping the composite structure in an anti-static envelope so as to form a quasi-rigid anti-static package.

Preferably, the method further comprises the step of securing the composite structure immediately before the wrapping step. The securing step preferably consists of fastening a strap around each end of the composite structure. The strap is preferably made of the same material as the rails so as to enable use of waste material generated during rail manufacture. The strap is preferably made with a hole at one end and a lug at the other end arranged to mate with the hole so that a portion of the lug extending through the hole is arranged to locate in a recess in the composite structure. The strap is preferably curved so as in use to be resilient to allow for tolerance in the size of the rails. Alternatively the securing step may consist of fixing a cap on each end of the composite structure.

Preferably, the wrapping step consists of wrapping the composite structure in a material which dissipates any internal electric charge and prevents ingress of external electric charge. The wrapping material preferably consists of a sandwich material comprising an outer layer of conductive material and an inner layer of static-dissipative material. Preferably, the outer layer is made of conductive paper to provide adequate snag- and tear-resistance and the inner layer may be made of an anti-static plastic material bonded to the outer layer. The wrapping step preferably consists of heat-wrapping the wrapping material on the composite structure.

Typically the rails are of trapezoidal cross-section. The composite structure preferably comprises one or more rows of rails each formed by adjacent rails arranged side-by-side alternately in opposite orientations so as to form a composite structure of rectangular cross-section. To aid the formation of such a composite structure the assembling step preferably comprises the steps of: inserting the rails into a former having one or more parallel recesses equal in number to the desired number of rows in the composite structure, each recess being sized to accept a rail inserted sideways into the recess and to accommodate said number of rails in a row of the composite structure; and removing the former from the inserted rails to leave the rectangular composite structure. Alternatively the composite structure may comprise a cylinder of adjacent rails arranged with their shorter parallel faces radially innermost and their longer parallel faces radially outermost. Other rails may be arranged in rectangular cross-section or other fashion within the cylinder as desired.

The rails may be formed with one or more formations such as longitudinal ribs or shoulders for enhancing the rigidity of the composite structure. The formations may be arranged to prevent sliding of the rails within the composite structure.

According to a second aspect of the invention, a material for use in packaging comprises: a sandwich material having a first layer of conductive material and a second portion which is static-dissipative, the first layer and the second portion being intimately bonded together. Preferably, the first layer is made of conductive paper to provide adequate snag- and tear-resistance for use as an outer layer and the second portion comprises a layer of anti-static plastics material heat bonded to the first layer for use as an inner layer. Alternatively, the second portion may comprise a layer of conductive plastics material and an anti-static adhesive bonding the conductive plastics layer to the first layer for use as an inner layer.

According to a third aspect of the invention, a packaged article for shipping comprises:
- a composite structure formed from a plurality of rails each loaded with components; and
- anti-static wrapping material enveloping the composite structure so as to form a quasi-rigid anti-static package.

BRIEF DESCRIPTION OF DRAWINGS

One method of packaging, one material for use in packaging and one packaged article in accordance with preferred embodiments of the present invention will now be described, by way of example only, with reference to the following drawings, in which.

DESCRIPTION OF PREFERRED EMBODIMENT

Figure 1:
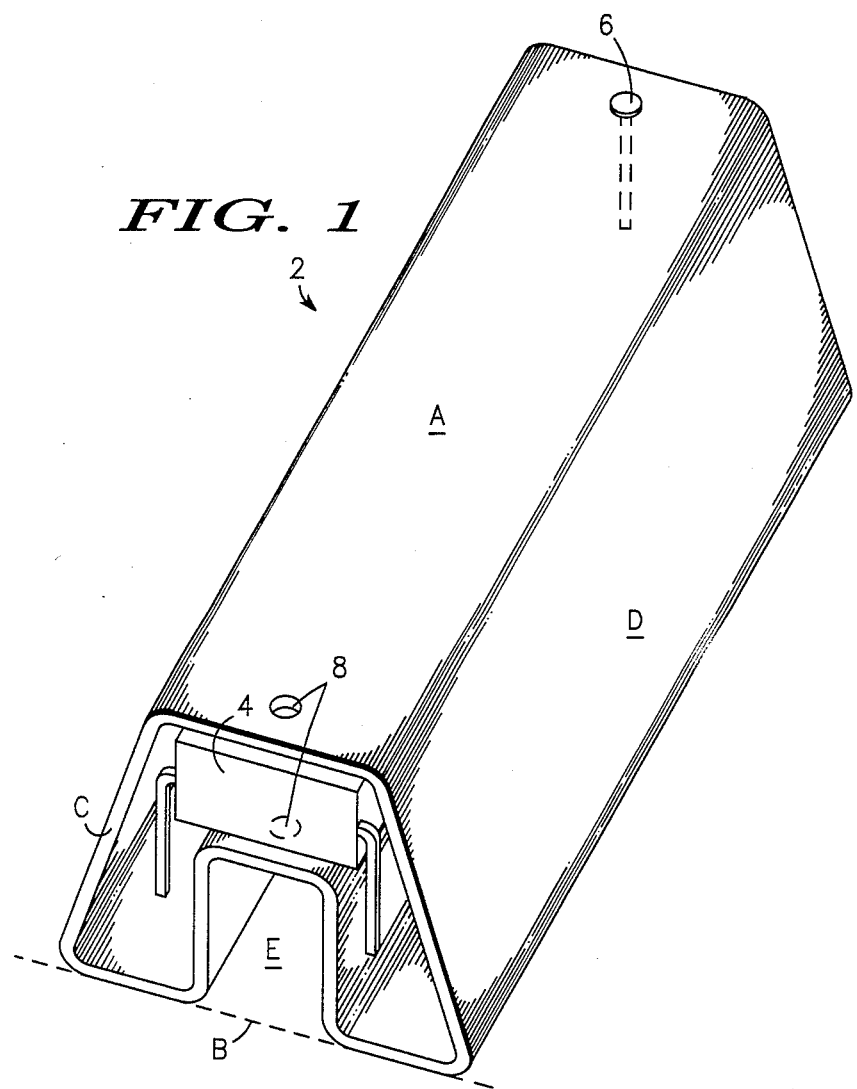
FIG. 1 shows in perspective view a rail for use in the method.

Referring firstly to FIG. 1, rails 2 for carrying semiconductor devices are formed as hollow extrusions of plastics material having a generally trapezoidal external cross-section with parallel sides A, B, inclined sides C, D and a channel E. The rails 2 are formed having an internal cavity with a cross-section shaped approximately in the form of an inverted "U". In order to provide anti-static protection to the semiconductor devices 4 to be carried therein, the rails 2 are fabricated from a plastics material having anti-static properties, or, more usually, for reasons of economy, coated after extrusion with an anti-static coating. Such anti-static rails are well known in the semiconductor packaging field.

Following manufacture and final testing in conventional manner, semiconductor devices such as 14-pin dual-in-line (DIL) plastic or ceramic packaged devices 4 are loaded into the rails 2. The devices 4 are inserted into the rails 2 by sliding the devices into the hollow rail interior so that the bodies of the devices are parallel with the parallel sides A, B of the rail and the metal electrodes of the devices extend into the "legs" of the "U" shape. Each rail 2 is loaded with a predetermined convenient number of semiconductor devices 4, for example 25, and the semiconductor devices 4 are secured in the rails by passing plastic pins 6 through holes 8 formed in the parallel sides A, B of each end of each rail; the pins 6 are arranged to be a push-fit into the holes 8 so as to ensure retention during shipping.

Figure 2:
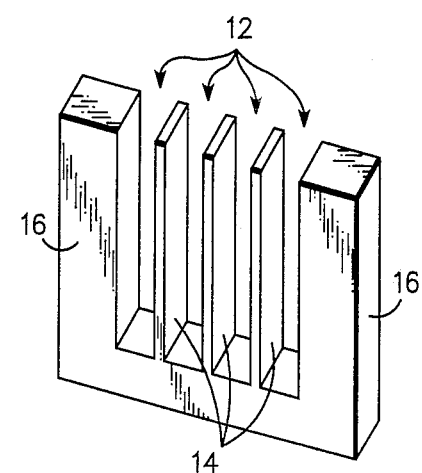
FIG. 2 shows a former for use in the method.

Referring now also to FIG. 2, the filled and pinned rails 2 are inserted into formers or combs 10. Each former 10 is made of rigid plastics or light alloy material and defines four parallel recesses 12 divided by thin arms 14. The recesses 12 are dimensioned so as to be of suitable width to accept a rail 2 inserted into the recess only with its parallel sides A, B parallel with the sides of the recess.

Rails 2 are inserted into the recesses 12 with the parallel sides A, B of the rails parallel with the sides of the recesses 12, and with the shorter parallel sides A of alternate rails in the same recess facing towards alternate shoulders 16 of the former so that the inclined sides C, D of adjacent rails in the same recess touch along substantially all their surfaces. Each recess 12 is filled in this manner with five rails so that the former then holds twenty rails arranged in an elongate rectangular bundle. At each end a strap 18 is then fastened around the bundle of rails so as to maintain the bundle as a quasi-rigid composite structure 20 containing a convenient number, in the present embodiment five hundred, of semiconductor devices.

Figure 3A:
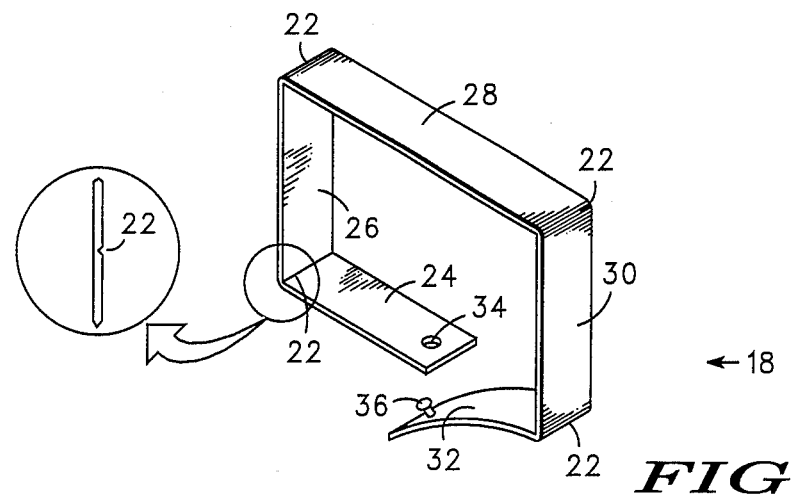
FIG. 3(a) shows a strap for use in the method.
Figure 3B:
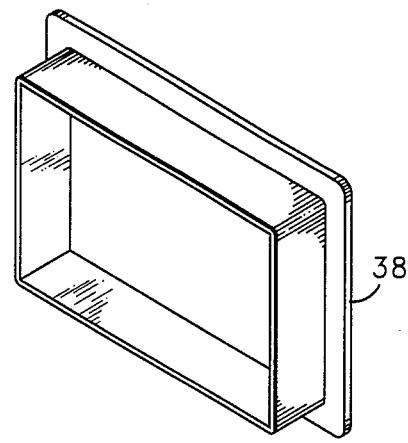
FIG. 3(b) shows an end cap for use in the method as an alternative to the strap shown in FIG. 3(a)
Figure 4:
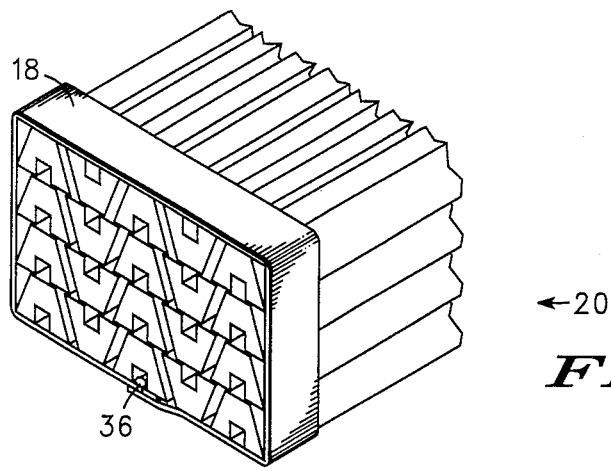
FIG. 4 shows in perspective view a composite structure of rails formed in the method.

Referring now also to FIGS. 3 and 4, the straps 18 are formed of plastics material and are moulded so as to form four relatively rigid corners 22 and five longitudinal elements 24, 26, 28, 30, 32. The end elements 24, 32 are provided respectively with a mating hole 34 and lug 36. The lug 36 is arranged to be a push-fit in the hole 34 so that when the strap 1 is positioned about the bundle of rails and the hole 34 and lug 36 are so mated, the bundle is maintained as a quasi-rigid composite structure 20. The hole 34 and lug 36 are so arranged that when positioned about the bundle of rails the end of the lug 36 extending through the hole 34 extends and keys into the channel E in one of the rails thereby providing additional security. In order for the strap 18 to allow for some variation in the size of the rails 2 making up the composite structure 20 while still providing sufficient security, the strap 18 is formed so as to be curved across its length rather than flat. In this way the resilience of the plastics material of the strap allows the curvature to be resiliently deformed to accommodate small variations in rail sizes.

The curvature may of course be either concave or convex and either across or along its length as desired. For convenience and economy the straps 18 are preferably made from the waste plastics material left over during the manufacture of the rails 2. It is not conventionally possible to re-use this waste material for extruding rails since the deterioration in material properties brought about by a second extrusion renders such material unacceptable for use as rails, but the waste material is suitable for moulding into straps such as 18. As an alternative to the straps 18 adhesive tape or push-on end caps 38 may be used to secure the composite structure 20.

The composite structure 20 is then withdrawn from the former 10 and wrapped in anti-static wrapping material 40.

Figure 5:
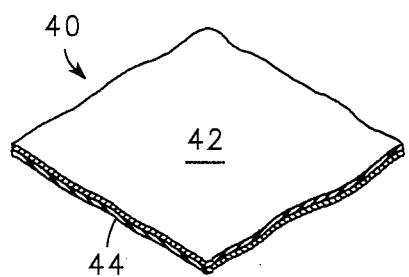
FIG. 5 shows an enlarged cross-sectional perspective view of a wrapping materials for use in the method and in accordance with a preferred embodiment of the present invention.
Figure 6:
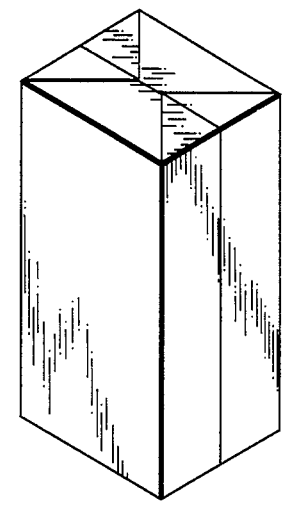
FIG. 6 shows a packaged article formed by the method and in accordance with a preferred embodiment of the present invention.

Referring now also to FIG. 5, the wrapping material 40 comprises a first, outer layer 42 of conductive paper and a second, inner layer 44 of anti-static plastics material. In a preferred form the first, outer layer is of paper having a thickness of 120 microns, a weight of 60 grams per square meter and a resistivity of $10^3$ ohms per square meter. The second, inner layer is formed of a conventional anti-static plastics material which is static-dissipative, i.e. dissipative but non-transconductive; for example the second, inner layer 44 may be formed of carbon-loaded polythene having a weight of 50 grams per square meter and a resistivity of $10^{10}$ ohms per square meter. The two layers 42, 44 are heat bonded together to form a sandwich wrapping material 40.

The composite structure of rails 20 is wrapped in the wrapping material 40 so that the wrapping material envelops the composite structure 20 and the wrapping material overlaps and is heat bonded onto itself to seal the package.

The packaged article 46 thus produced is suitable for shipping in this form without further packaging. The packaged article is of a quasi-rigid nature possessing sufficient rigidity and physical protection to withstand all expected physical damage during shipping and possessing sufficient anti-static protection to protect against all expected static electric hazards during shipping. Since the outer layer 40 is of paper it endows the packaged article with enhanced snag- and tear-resistance and also offers the advantage of being able to be coloured at little or no additional cost so as to achieve maximum customer acceptability.

It has been found that as an alternative to the inner layer 44 of the wrapping material 40 being formed of static-dissipative plastics material as described above, sufficient anti-static protection during shipping may be afforded to the devices 4 in the anti-static rails 2 if the inner layer of the wrapping material is of conventional conductive plastics material (for example, carbon-loaded polythene having a weight of 50 grams per square meter and a resistivity of $10^5$ ohms per square meter) and if the inner plastics layer and the outer paper layer are bonded together by a conventional polythene adhesive having static-dissipative properties, for example low-density polyethylene (LDPE).

It will be appreciated that by packaging the semiconductor devices in this way, each package is lighter than if packaged in a cardboard box, so saving weight and volume and therefore shipping costs. Also, since each packaged article contains a convenient number (e.g. five hundred) of devices there is little or no need for the packages to be opened before reaching the OEM or other end customer and since each packaged article is provided with sufficient physical and anti-static protection and since this protection does not deteriorate during packaging and shipping (as can happen with a cardboard box lined with carbon-black) the OEM or other end customer can have confidence in the integrity of the semiconductor devices in the received packages and does not need to re-test them. Thus the overall cost to the OEM or other end customer of devices packaged in this way is reduced compared with conventional packaging.

It will of course be appreciated that the composite structure 20 may comprise more or fewer than twenty rails, as desired. If it were desired to form the composite structure 20 with fewer than twenty rails this could be done by reducing the number of rails to, for example, three rows of four rails, rather than four rows of five rails as in the above example. This could be easily achieved using the same former 10, but filling only three of the recesses 12 with four rails each in the same alternating manner as above to produce a quasi-rigid composite structure.

It will also be appreciated that when the former is filled with the required number of rails, if desired, the rails need not be secured before wrapping. This may be more convenient if the composite structure is sufficiently stable when removed from the former that it can be still be handled well and provided also that when wrapped the package retains sufficient rigidity.

Figure 7:
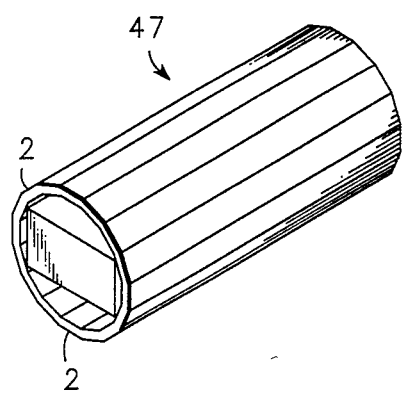
FIG. 7 shows in perspective view an alternative composite structure of rails for use in the present invention.

It will also be appreciated that, alternatively to the composite structure of rectangular cross-section described above, the composite structure may be of any desired shape which produces sufficient rigidity. For example, FIG. 7 shows a composite structure having a circular cross-section. In this structure the rails are arranged around a circle with each of the inclined faces C, D touching face-to-face but with each rail having its smaller parallel face A facing radially inward. It will be appreciated that this formation can be built up on a former having a wheel-like shape with a number of outwardly extending spokes defining trapezoidal recesses therebetween around its periphery. The centre of the cylindrical composite structure may be filled with a rectangular composite structure (as shown) as described above or with any other arrangement as desired.

It will also be appreciated that, alternatively to the wrapping procedure described above, the wrapping material 40 may be pre-fabricated into an appropriately sized open-ended bag, into which the composite structure is inserted, and the or each open end of which is sealed by heat bonding to seal the package. If desired, alternatively to heat bonding the wrapping material to seal the package, the package may be sealed by the use of an adhesive (for example a contact adhesive) to seal the wrapping material onto itself. The use of such an adhesive offers the advantage of reducing the packaging cycle time compared with heat bonding and also offers the possibility of re-sealing the package after opening if the bag is opened with minimal damage to the wrapping material.

Figure 8:
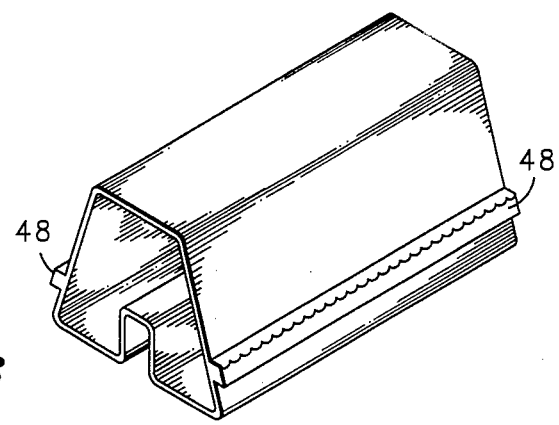
FIG. 8 shows in perspective view an alternative rail for use in the present invention.

It will also be appreciated that, alternatively to the profile of rail shown in FIG. 1 and described above, the rail profile may be altered as desired to enhance the rigidity of the composite structure 20. For example, FIG. 8 shows a rail similar to the rail of FIG. 1 in having the same basic trapezoidal shape, but differing from the rail of FIG. 1 in that it has rib or shoulder formation 48 along its length on each of its inclined faces. It will be understood that these formations on adjacent rails engage each other when the rails are arranged in the composite structure and serve to increase the overall rigidity of the composite structure. It will be understood that the serrations on the top of each of the shoulders mesh on adjacent rails when the rails are arranged in the composite structure and serve to prevent sliding of the rails within the composite structure, further increasing the overall rigidity of the composite structure.

I claim:

1. A method of packaging semiconductor integrated circuit components for shipping comprising:
   loading the components in rails;
   assembling a plurality of the rails into a composite self-supporting structure; and
   wrapping the composite structure in an anti-static envelope so as to form a quasi-rigid anti-static package.

2. A method according to claim 1 further comprising the step of securing the composite structure immediately before the wrapping step.

3. A method according to claim 2 wherein the securing step comprises fastening a strap around each end of the composite structure.

4. A method according to claim 3 wherein the strap is made of the same material as the rails.

5. A method according to claim 4 wherein the strap is made from waste material generated during rail manufacture.

6. A method according to claim 3 wherein the strap is made with a hole at one end and a lug at the other end arranged to mate with the hole so that a portion of the lug extending through the hole is arranged to locate in a recess in the composite structure.

7. A method according to claim 3 wherein the strap is curved so as in use to be resilient to allow for tolerance in the size of the rails.

8. A method according to claim 2 wherein the securing step consists of fixing a cap on each end of the composite structure.

9. A method according to claim 1 wherein the wrapping step consists of wrapping the composite structure in a material which dissipates any internal electric charge and prevents ingress of external electric charge.

10. A method according to claim 9 wherein the wrapping material consists of a sandwich material comprising an outer layer of conductive material and an inner portion which is static-dissipative.

11. A method according to claim 10 wherein the outer layer is made of conductive paper and the inner portion comprises a layer of anti-static plastics material heat bonded to the outer layer.

12. A method according to claim 10 wherein the outer layer is made of conductive paper and the inner portion comprises a layer of conductive plastics material and an anti-static adhesive material bonding the conductive plastics layer to the conductive paper layer.

13. A method according to claim 1 wherein the rails are of generally trapezoidal cross-section.

14. A method according to claim 1 wherein the composite structure comprises one or more rows of rails each formed by adjacent rails arranged side-by-side alternately in opposite orientations so as to form a composite structure of rectangular cross-section.

15. A method of packaging components for shipping comprising:
loading the components in rails;
assembling a plurality of the rails into a composite structure; and
wrapping the composite structure in an anti-static envelope so as to form a quasi-rigid anti-static package, wherein the composite structure comprises one or more rows of rails each formed by adjacent rails arranged side-by-side alternately in opposite orientation so as to form a composite structure of rectangular cross-section, and wherein the assembling step preferably comprises the steps of:
inserting the rails into a former having one or more parallel recesses equal in number to the desired number of rows in the composite structure, each recess being sized to accept a rail inserted sideways into the recess and to accommodate said number of rails in a row of the composite structure;
and removing the former from the inserted rails to leave the rectangular composite structure.

16. A method of packaging components for shipping comprising:
loading the components in rails;
assembling a plurality of the rails into a composite structure; and
wrapping the composite structure in an anti-static envelope so as to form a quasi-rigid anti-static package, wherein the rails are of generally trapezoidal cross-section, and wherein the composite structure comprises a cylinder of adjacent rails arranged with their shorter parallel faces radially innermost and their longer parallel faces radially outermost.

17. A method according to claim 16 wherein additional rails are arranged within the cylinder.

18. A method according to claim 17 wherein the additional rails are arranged in rectangular cross-section.

19. A method according to claim 1 wherein the rails have one or more formations for enhancing the rigidity of the composite structure.

20. A method according to claim 1 wherein the rails have one or more formations to prevent sliding of the rails within the composite structure.

* * * * *